(12) United States Patent
Morales et al.

(10) Patent No.: US 6,472,459 B2
(45) Date of Patent: Oct. 29, 2002

(54) FABRICATION OF METALLIC MICROSTRUCTURES BY MICROMOLDING NANOPARTICLES

(75) Inventors: Alfredo M. Morales, Livermore, CA (US); Michael R. Winter, Goleta, CA (US); Linda A. Domeier, Danville, CA (US); Shawn M. Allan, Henrietta, NY (US); Dawn M. Skala, Fremont, CA (US)

(73) Assignee: Sandia Corporation, Livermore, CA (US)

( * ) Notice: Subject to any disclaimer, the term of this patent is extended or adjusted under 35 U.S.C. 154(b) by 74 days.

(21) Appl. No.: 09/764,615

(22) Filed: Jan. 16, 2001

(65) Prior Publication Data

US 2001/0038803 A1 Nov. 8, 2001

Related U.S. Application Data

(63) Continuation-in-part of application No. 09/325,003, filed on Jun. 2, 1999, now Pat. No. 6,245,849.

(51) Int. Cl.[7] .................................................. C08K 3/08
(52) U.S. Cl. ........................ 524/439; 524/440; 524/441; 419/38; 419/39; 419/42
(58) Field of Search ........................ 24/439, 440, 441; 419/38, 39, 42

(56) References Cited

U.S. PATENT DOCUMENTS

| | | |
|---|---|---|
| 5,189,777 A | 3/1993 | Guckel et al. |
| 5,190,637 A | 3/1993 | Guckel |
| 5,206,983 A | 5/1993 | Guckel et al. |
| 5,327,033 A | 7/1994 | Guckel et al. |
| 5,357,807 A | 10/1994 | Guckel et al. |
| 5,576,147 A | 11/1996 | Guckel |

FOREIGN PATENT DOCUMENTS

| | | |
|---|---|---|
| DE | 19605521 | 7/1997 |

OTHER PUBLICATIONS

Andrievsky (1998), "State–of–the–Art and Perspectives in the Field of Particulate Nanostructured Materials," *J. Mater. Sci. Technol.*, 14:97–103.

Becker et al. (1986), "Fabrication of Microstructures with High Aspect Ratios and Great Structural Heights by Synchrotron Radiation Lithography, Galvanoforming, and Plastic Moulding (LIGA Process)," *Microelectronic Engineering*, 4(1):35–56.

Ehrfeld et al. (1998), "LIGA Process: Sensor Construction Techniques via x–Ray Lithography," *Tech.Digest from IEEE Solid–State Sensor and Actuator Workshop*, Hilton Head, SC.

Guckel et al. (1991), "Fabrication and Testing of the Planar Magnetic Micromotor," *J. Micromech. Microeng.*, 1:135–138.

Hruby et al. (1999), "LIGA: Metals, Plastics, and Ceramics," *SPIE Conference on Micromachining and Microfabrication Process Technology V* 3874:32–43.

Primary Examiner—Edward J. Cain
(74) Attorney, Agent, or Firm—Reed & Associates; J. Elin Hartrum

(57) ABSTRACT

A method is provided for fabricating metallic microstructures, i.e., microcomponents of micron or submicron dimensions. A molding composition is prepared containing an optional binder and nanometer size (1 to 1000 nm in diameter) metallic particles. A mold, such as a lithographically patterned mold, preferably a LIGA or a negative photoresist mold, is filled with the molding composition and compressed. The resulting microstructures are then removed from the mold and the resulting metallic microstructures so provided are then sintered.

44 Claims, 8 Drawing Sheets

US 6,472,459 B2

FABRICATION OF METALLIC MICROSTRUCTURES BY MICROMOLDING NANOPARTICLES

CROSS-REFERENCE To RELATED APPLICATIONS

This is a continuation-in-part of U.S. patent application Ser. No. 09/325,003, filed Jun. 2, 1999 now U.S. Pat. No. 6,245,849, the disclosure which is incorporated by reference herein.

ACKNOWLEDGEMENT OF GOVERNMENT SUPPORT

The United States Government has rights in this invention pursuant to Contact No. DE-AC04-94AL85000 between the Unites States Department of Energy and Sandia Corporation for the operation of Sandia National Laboratories.

TECHNICAL FIELD

This invention relates generally to the preparation of metallic microstructures. More specifically, the invention relates to the fabrication of metallic components of micron or submicron dimensions using compositions containing metallic nanoparticles and lithographically or otherwise patterned molds. The invention pertains to miniaturization and "nanotechnology," and has utility in many fields, including microelectromechanical system fabrication, semiconductor processing, information storage, medical diagnostics, optics, materials science, and structural engineering.

BACKGROUND

"Nanotechnology" refers to nanometer-scale manufacturing processes, materials and devices, as associated with, for example, nanometer-scale lithography and nanometer-scale information storage. See, for example, *Nanotechnology*, ed. G. Timp (New York: Springer-Verlag, 1999), and *Nanoparticles and Nanostructured Films*, ed. J. H. Fendler (Weinheim, Germany: Wiley-VCH, 1998). Nanometer-scale components find utility in a wide variety of fields, particularly in the fabrication of microelectromechanical systems (commonly referred to as "MEMS"). Such systems include, for example, micro-sensors, micro-actuators, micro-instruments, micro-optics, and the like. Many MEMS fabrication processes exist and they tend to fall into the two categories of surface micro-machining and bulk-micromachining. The latter technique involves formation of microstructuring by etching directly into a bulk material, typically using wet chemical etching or reactive ion etching ("RIE"). Surface micro-machining involves fabrication of microelectromechanical systems from films deposited on the surface of a substrate, e.g., from thin layers of polysilicon deposited on a sacrificial layer of silicon dioxide present on a single crystal silicon substrate (this technique is commonly referred to as the "thin film polysilicon process").

An exemplary surface micro-machining process is known as "LIGA." See, for example, Becker et al. (1986), "Fabrication of Microstructures with High Aspect Ratios and Great Structural Heights by Synchrotron Radiation Lithography Galvanoforming, and Plastic Moulding (LIGA Process)," *Microelectronic Engineering* 4(1):35–36; Ehrfeld et al. (1988), "1988 LIGA Process: Sensor Construction Techniques via x-Ray Lithography," *Tech. Digest from IEEE Solid-State Sensor and Actuator Workshop*, Hilton Head, S.C.; Guckel et al. (1991) *J. Micromech. Microeng.* 1: 135–138. A related process is termed "SLIGA," and refers to a LIGA process involving sacrificial layers. LIGA is the German acronym for X-ray lithography ("lithographic"), electrodeposition ("galvanoformung") and molding ("abformung"), and was developed in the mid-1970's. LIGA involves deposition of a relatively thick layer of an X-ray resist on a substrate, e.g., metallized silicon, followed by exposure to high-energy X-ray radiation through an X-ray mask, and removal of the irradiated resist portions using a chemical developer. The mold so provided can be used to prepare structures having horizontal dimensions, i.e., diameters, on the order of microns. The technique is now used to prepare metallic microcomponents by electroplating in the recesses (i.e., the developed regions) of the LIGA mold. See, for example, U.S. Pat. Nos. 5,190,637 and 5,576,147 both to Guckel et al.

While metallic microcomponents are useful in a host of applications, currently microcomponents can only be fabricated from electroplateable metals. The ability to produce metallic components from non-electroplateable metals is obviously desirable as well. Microcomponents produced from such non-electroplateable metals, i.e., stainless steel, aluminum, titanium, and shape memory alloy, would clearly be useful in a number of applications, insofar as such materials can provide a host of advantageous properties, including increased toughness, thermal stability, chemical and biological compatibility, magnetism, etc. To date, however, no suitable method has been developed for the fabrication of metallic microstructures from non-electroplateable materials or for the fabrication of metallic microstructures comprised of uniform alloy compositions.

SUMMARY OF THE INVENTION

Accordingly, the invention is directed to the aforementioned need in the art and provides a method for making metallic microstructures, i.e., metallic components of micron or submicron dimensions from virtually any metal or metal alloy, electroplateable or not.

It is another object of the invention to provide a method that involves compressing, into a patterned mold, a molding composition comprising metallic nanoparticles and an optional binder, and then removing and at least partially sintering the resulting metallic microstructures.

It is still another object of the invention to provide such a method wherein the patterned mold is a lithographically patterned mold such as a LIGA mold.

It is still another object of the invention to provide such a method wherein the patterned mold is an epoxy-based negative resist patterned mold such as SU8-25.

It is still another object of the invention to provide such a method wherein the patterned mold is a plastic replicate of a master mold prepared via LIGA or other technologies. Such replicates might be fabricated by hot embossing or injection molding technologies.

It is yet another object of the invention to provide such a method wherein the molding composition additionally comprises a fluxing agent.

It is still a further object of the invention to provide novel metallic microcomponents fabricated using the methodology disclosed and claimed herein.

Additional objects, advantages and novel features of the invention will be set forth in part in the description which follows, and, in part, will become apparent to those skilled in the art upon examination of the following, or may be learned by practice of the invention.

In one aspect of the invention, then, a process for preparing metallic microstructures is provided which involves compression molding a molding composition in a suitable mold (typically a lithographically patterned mold such as a LIGA mold or a negative photoresist or a plastic replicate thereof) wherein the molding composition is comprised of nanoparticles of a metallic material and an optional binder. The compressed molding composition provides green metallic microstructures within the voids of the patterned relief surface on the mold that is employed. Following planarization, the green microstructures are removed from the mold and are at least partially sintered. Metallic components of micron or submicron dimensions can be prepared in this manner with any metallic material that is capable of being provided in a nanoparticulate form. In addition, depending on the metallic material selected, metallic microstructures can be fabricated with desirable optical, structural, magnetic, or other properties. Partial sintering allows for the formation of nanoporous microstructures, which may be used in filtration and/or separation.

In an additional aspect of the invention, certain metallic microstructures are prepared as novel compositions of matter. The novel metallic microstructures comprise a sintered, or partially sintered, compressed solid of metallic nanoparticles.

DETAILED DESCRIPTION OF THE INVENTION

Figure 1:
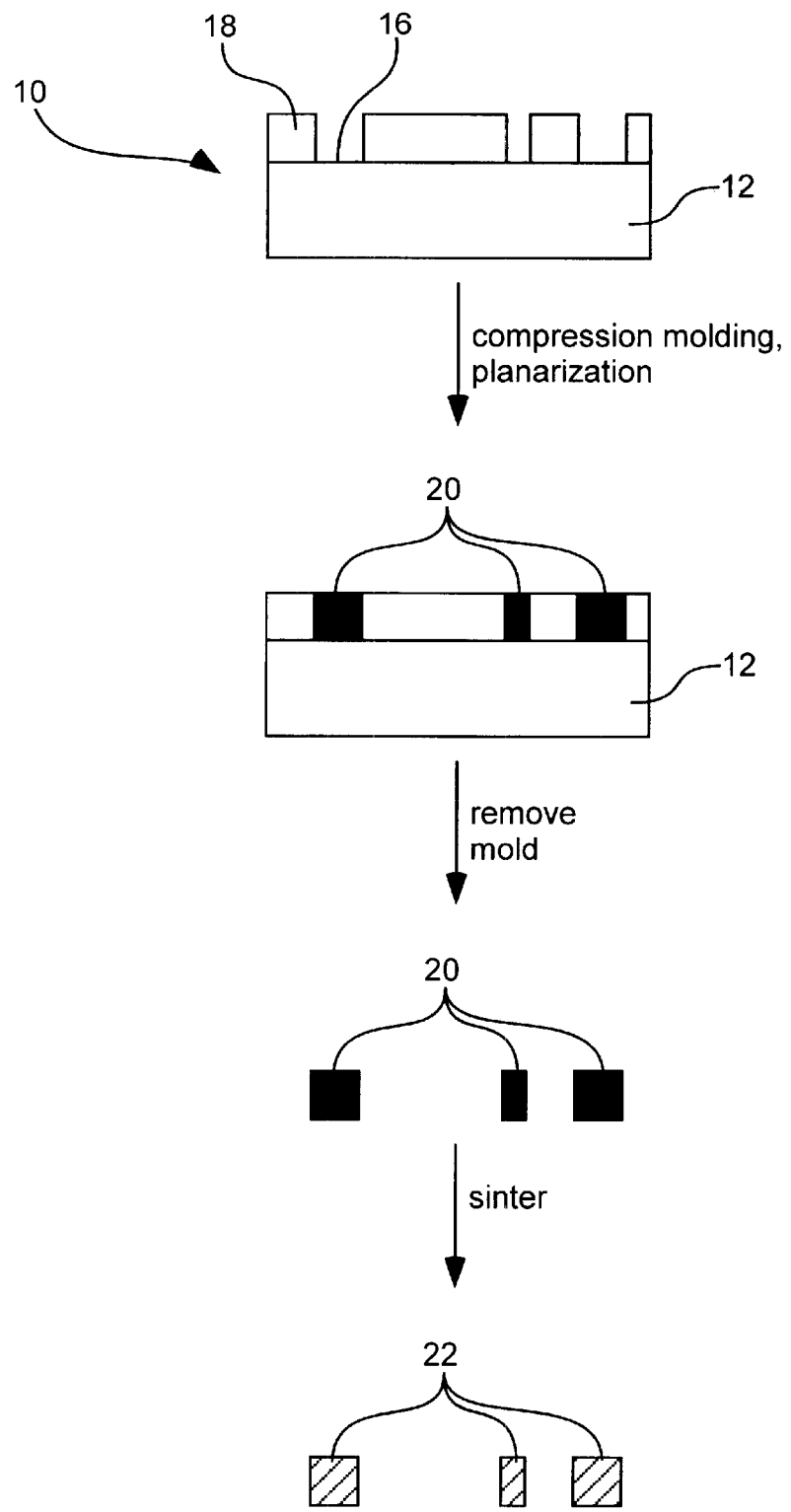
FIG. 1 schematically illustrates fabrication of metallic microstructures according to the invention.

It is to be understood that unless otherwise indicated, this invention is not limited to specific materials (e.g., specific polymers or ceramic materials), processing conditions, manufacturing equipment, or the like, as such may vary. It is also to be understood that the terminology used herein is for the purpose of describing particular embodiments only and is not intended to be limiting.

It must be noted that, as used in the specification and the appended claims, the singular forms "a," "an" and "the" include plural referents unless the context clearly dictates otherwise. Thus, for example, reference to "a fluxing agent" includes mixtures of fluxing agents, reference to "a metallic material" includes mixtures of metallic materials, and the like.

The term "metallic material" is used to refer to material that contains metallic material or is wholly metallic in nature. Thus, the term "metallic materials" as used herein encompasses alloys and composites, containing both metallic and non-metallic material such as metal oxides as well as materials that are entirely metallic and do not contain any nonmetallic material.

The terms "microstructure" and "microcomponent" are used interchangeably herein to refer to a three-dimensional solid structure whose height, width (or diameter) or length is less than about 100 microns, i.e., at least one dimension of the three-dimensional structure is less than about 100 microns. A "green microstructure" or "green metallic microstructure" refers to a compressed microstructure that has not been sintered.

The term "aspect ratio" is used herein in its conventional sense to refer to the ratio of an object's height to its width (or diameter). High aspect ratio structures are thus prepared using molds (such as LIGA molds) having voids, or recesses, that are extremely narrow relative to their height.

"Optional" or "optionally" means that the subsequently described circumstance may or may not occur, so that the description includes instances where the circumstance occurs and instances where it does not. For example, the phrase "optionally including a fluxing agent" means that a material may or may not include a fluxing agent. Similarly, a microstructure fabrication method or system that includes an "optionally present" release layer encompasses methods and systems that make use of a release layer as well as methods and systems that do not.

The invention thus features a process for preparing metallic microstructures which involves, initially, providing a substrate having a patterned relief structure on its surface to serve as a mold, wherein the microstructures are to be formed within the recesses present within the pattern, i.e., around and between corresponding elevated segments on the substrate surface. The mold is filled with a molding composition containing metallic nanoparticles and optionally a binder, and external pressure is applied to press the composition into the mold to provide a green, pre-sintered material, i.e., green metallic microstructures, in the recesses of the mold. Preferably, the surface is then planarized; the mold refilled with molding composition and increased external pressure applied. Most preferably, filling and compression are repeated at least three times. At this point, the green microstructures can be removed and at least partially sintered.

The mold is typically, although not necessarily, a lithographically patterned mold, prepared, for example, using optical, X-ray, electron-beam, or ion-beam methods, but preferably fabricated using LIGA technology. As will be appreciated by those skilled in the art, preparation of a LIGA mold involves deposition of a layer of an X-ray resist on a substrate having a conductive surface, which may or may not be pretreated with an adhesion-promoting layer such as a metal oxide (e.g., oxides of titanium and/or copper) or with a silanization reagent such as methacryloxypropyl trimethoxysilane, to facilitate adhesion of the resist to the substrate surface. Metallized silicon is a preferred substrate.

Suitable X-ray resists may comprise, for example, poly (methyl methacrylate) ("PMMA") or copolymers thereof such as poly(methyl methacrylate-co-t-butylmethacrylate), a poly(lactide) such as poly(lactide-co-glycolide), polymethacrylamide, polyoxymethylene, polyalkenesulfone, or poly(glycidylmethacrylate-co-ethyl acrylate). The resist is deposited using any of a number of conventional techniques, e.g., sequential spin coating or the like. The deposited resist is irradiated using X-ray radiation, such as from a synchrotron, and an X-ray mask to provide the desired mold pattern. Following exposure, the resist is developed using a suitable solvent to remove the irradiated areas. The resulting mold, then, is comprised of a substrate having a patterned relief structure on the substrate surface comprised of elevated segments (i.e., the undeveloped resist) with corresponding voids therebetween.

The molds that can be used in conjunction with the present invention may also be fabricated using other techniques, as alluded to above. LIGA and negative photoresist molds are preferred, however, insofar as such molds can be prepared so as to have very high aspect ratios, and can thus provide high aspect ratio metallic microstructures. The molds may also be fabricated by hot embossing or injection molding techniques. In such techniques, a mold master is fabricated using a LIGA, SU8-25 or other high aspect ratio producing process to provide a metal tool or stamp with microfeatures. The metal tool or stamp is then used to produce plastic replicates, e.g., via hot embossing or injection molding of PMMA.

In one embodiment, the surface of the mold is treated or coated with an additional layer of material. This may be done so that removal of green microstructures fabricated thereon is facilitated or to incorporate the coating layer into the green microstructure thereby allowing greater control of the surface properties of the resulting metallic microstructure. Suitable surface treatments include, but are not limited to, polishing, application of a low adhesion coating comprised of a material-releasing agent such as poly (tetrafluoroethylene), silicones, waxes or the like, deposition of a decomposable or otherwise removable release layer (as may also be termed a "sacrificial" layer) such as a poly (methyl methacrylate), and application of a microstructure surface coating layer such as stainless steel, aluminum, nickel, iron, titanium, copper, gold, silver, tungsten, and mixtures thereof. Such coating layers may be applied by vapor deposition, sputtering or, when possible, electroplating techniques.

After the mold is prepared, a molding composition is prepared comprising an optional binder and metallic nanoparticles. When included in the molding composition, the binder serves to hold the metallic particles of the green microstructure in the desired shape after pressing. The binder also provides lubrication while the particles are pressed. Preferably, the binder combusts or vaporizes completely during the sintering process leaving no trace of the binder in the final metallic product. Binders useful in conjunction with the invention include, but are not limited to, wax- or oil-based binders such as Acrawax® C® (Glyco), Advawax® 240, 275, 280, 290 (Carstab), Eramid® (Hexcel), Glucolube® VL (Glyco), Hostalub® FA 1 (Amer. Hoechst), HSTA 1, 3 (Hexcel), Interstab® G-8257, Kantstik® S powder (Specialy Prod.), Kemamide® W-20, W-40, E (Humko Chem.), Nopcowax® 22DS (Synthetic Prod.), Paricin®285, 220 (NL Industries), Ross Wax® 140 (Frank B. Ross), and Slip-Eze®, Slip-Quick®, Vyn-Eze® (Hexcel) and the like; lower alkanols ($C_1$–$C_6$ alkanols, preferably $C_1$–$C_4$ alkanols) such as ethanol, isopropanol, and the like; or traditional dispersant/binder systems used in ceramic possessing, such as polymethacrylate/polyvinyl alcohol/ polyethylene glycol systems.

Suitable binders will be well known to those skilled in the art and one skilled in the art will appreciate that the use of and choice of binder will be dependent upon the type of metallic nanoparticle to be used. Depending on the specific surface chemistry of the metallic nanoparticle to be used, appropriate binders and/or binder systems may be selected to maximize desired green strength characteristics, such as the ability to maintain sharpness of contour and physical integrity during handling and mechanical operations to prepare it for sintering. When included, the binder will normally represent from about 1 wt. % to about 50 wt. % of the molding composition, with 5 wt. % to about 30% wt. % being more typical. Metals having surface chemistry that does not necessitate the use of a binder include, but are not limited to, copper and nickel.

The metallic nanoparticles may be obtained commercially (e.g., from TPL [Technologies to Products], Albuquerque, N. Mex.; Materials Modification, Incl, Fairfax, Va.; Argonide Corporation, Sanford, Fla.; and Nanophase Technologies Corporation, Burr Bridge, Ill.) or fabricated using techniques known to those skilled in the art and/or described in the pertinent texts and literature (see, e.g., R. A. Andrievsky (1998), "State-of-the-Art and Perspectives in the Field of Particulate Nanostructured Materials," *J. Mater. Sci. Technol.* 14:97–103). Generally, the nanoparticles will be approximately 1 nm to approximately 1000 nm in diameter, preferably approximately 1 nm to approximately 500 nm in diameter, and most preferably approximately 1 nm to approximately 100 nm in diameter. Any metallic material can be used, and the process of the invention is not in any way limited with regard to a specific metallic material or materials. However, as certain metallic materials can provide a specific function in a particular context, the context may dictate choice of material. The metallic nanoparticles generally represent on the order of 5 wt. % to 100 wt. % of the molding composition, preferably about 15 wt. % to 100 wt. % of the composition, while the binder component per se typically represents about 0 wt. % to 50 wt. %, preferably about 0 wt. % to 30 wt. % of the composition.

The molding composition is typically prepared by simple admixture of the components. When included the binder is generally added in an amount sufficient to provide the composition in the form of a paste of a desired viscosity, suitable for application to the mold described above. The molding composition may contain other components as well, such as additional binders, catalysts, metal powders, flexibilizers, surfactants, nanoparticle surface modifying primers, etc.

In the event that the metallic particles are subject to oxide formation on the surface of the particles, for example, aluminum particles having a coating of aluminum oxide, the molding composition may additionally comprise a fluxing agent. The fluxing agent serves to remove a significant amount of the oxide layer, thereby enhancing the ability of the molding composition to form the green microstructure and aiding in the final sintering process. Examples of common fluxing agents in general use include abietic acid, stearic acid, hydrochloric acid, amine hydrochlorides and amine resins.

In this application, either a suitable commercial flux formulation or a specially formulated fluxing agent may be utilized. A presently preferred fluxing agent comprises a mixture containing a mono- or polyanhydride with water, alcohol, or polyol. Hydrogenated phthalic anhydrides are preferred. Suitable polyols and alcohols include, but are not limited to, ethanol, methanol, propanol, butanol, isobutanol, isopropanol, butyl carbitol, methanol, ethylene glycol, glycerol, meso-erythritol, adonitol, sorbitol and the like. Glycerol is a preferred polyol. The preferred anhydride is methyl hexahydrophthalic anhydride (MHHPA), a liquid anhydride. The various elements of the fluxing agent mixture may also act as binders in addition to forming the fluxing agent.

The metal particle/optional binder/fluxing agent composition so prepared is then applied to the mold and pressure is applied to ensure that the mold is completely filled. The amount of pressure applied to the filled mold is dependent upon the type of mold utilized. When LIGA type PMMA molds are used, the applied pressure is in the range of from about 5000 psi to about 10,000 psi. For negative resist type molds, such as SU8-25, the applied pressure is generally in the range of from about 20,000 psi to about 40,000 psi.

Following compression, the mold surface is planarized using conventional equipment and techniques to remove excess molding composition. The mold may then be refilled and compressed with an increased amount of pressure applied. The surface may then be replanarized and then filled and compressed once again. This step may be repeated any number of times, as desired. In a preferred embodiment, the mold is packed and compressed three times with increased applied pressure used for each pressing. When PMMA molds are used, the initial compression is at about 6,000 psi, the second compression at about 7,500 psi and the third compression at about 9,000 psi. In systems using SU8-25 type molds, the applied pressures for each of the compressions are about 22,500 psi, about 30,000 psi and about 37,500 psi, respectively. The green microstructures are then removed from the mold. When PMMA molds are used, the microstructures may be removed by suspending the filled mold in a suitable solvent, such as a methylene chloride/acetone solution. As the PMMA expands and dissolves, the microstructures are released. When insoluble molds are used, i.e., SU8-25 molds, the microstructures can be removed by charring the filled mold and then peeling away the charred mold from the microstructures.

The green microstructures prepared as just described are then sintered. In one method of sintering, a tube furnace equipped with a three-inch mullite tube is used. Initially, only one end of the tube is capped. The capped end is connected to the boil off from a liquid nitrogen line for purging of the furnace and to about a 3.90% $H_2/N_2$ line for reducing atmosphere sintering. The green microstructures are placed in the 3" tube furnace and ramped at about 10° C./minute to about 350° C. in air for a minimum of 1 hour to burn off the binder components and residual PMMA from demolding (when PMMA molds have been used). The furnace is then cooled and the microstructures may be covered with a suitable object, such as a flat alumina plate, in order to reduce warping during the final sintering. The furnace is flushed for one minute with nitrogen from the liquid nitrogen-holding tank. The microstructures are replaced into the furnace; and the other end of the tube is also capped allowing for a small flow of gas that is vented to the roof of the lab. Throughout the entire sintering process, about 0.5 standard cubic centimeters/minute of roughly 3.90% $H_2/N_2$ is run through the tube. The furnace is ramped to about 600° C. at about 15° C./min. for an approximately one-hour dwell period. If a nanoporous microstructure is desired, the sintering time may be reduced to allow for only partial sintering of the resulting microstructure. One skilled in the art will appreciate that sintering temperature and duration may be varied according to the degree of sintering desired and according to the characteristics of the metallic nanoparticles used.

The method of the invention is illustrated schematically in FIG. 1, where the patterned mold is shown generally at 10, comprised of substrate 12 and voids 16 between corresponding elevated segments 18. The molding composition, having been introduced into the mold, compressed, and the mold then planarized, is shown at 20. Following any repeated filling and compression cycles, the green microstructures 20 are provided upon removal from the mold. Upon sintering, the final metallic microstructures are produced, indicated at 22.

Figure 2:
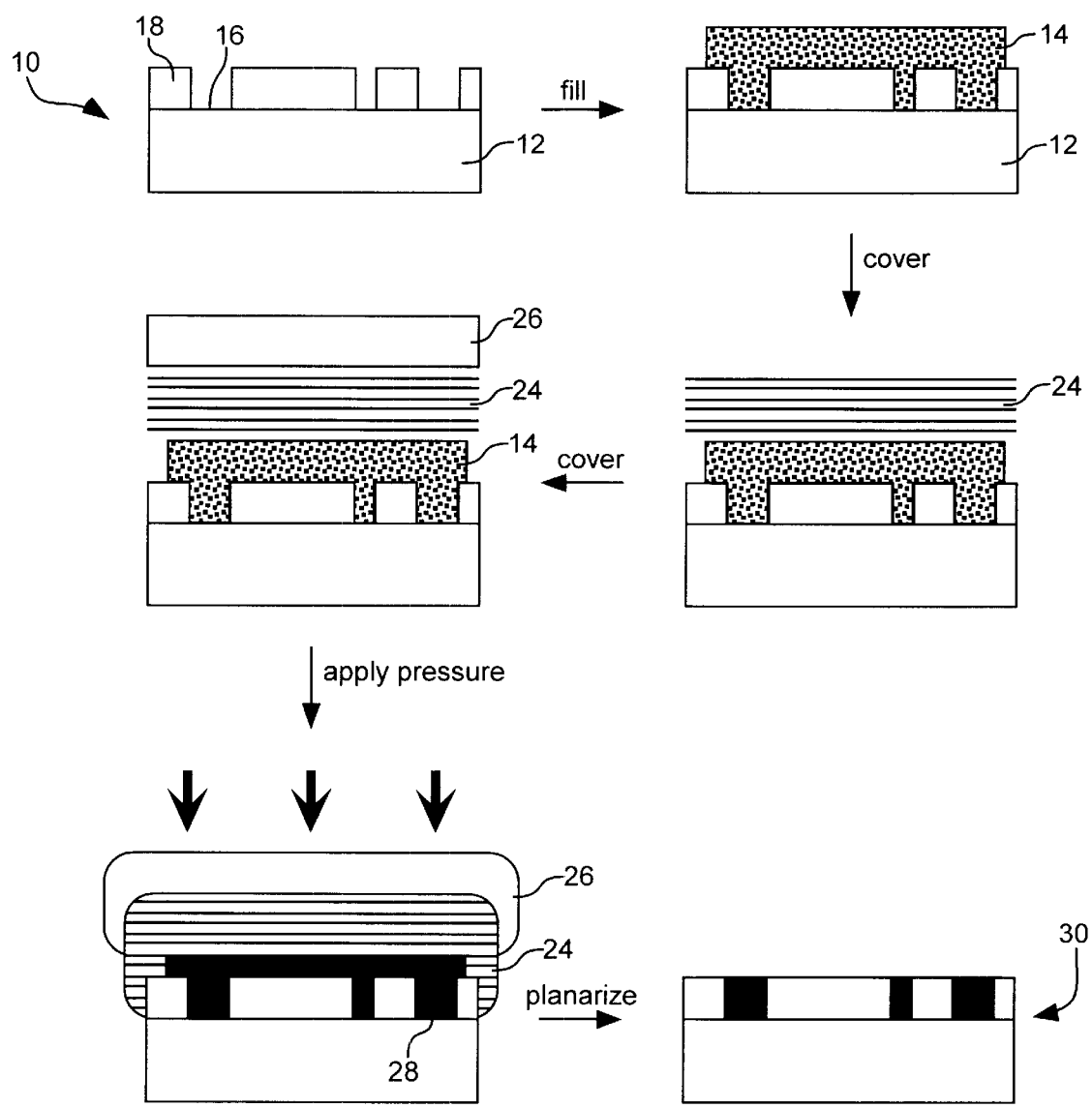
FIG. 2 schematically illustrates formation of the green metallic microstructures within a mold, according to the invention.
Figure 3:
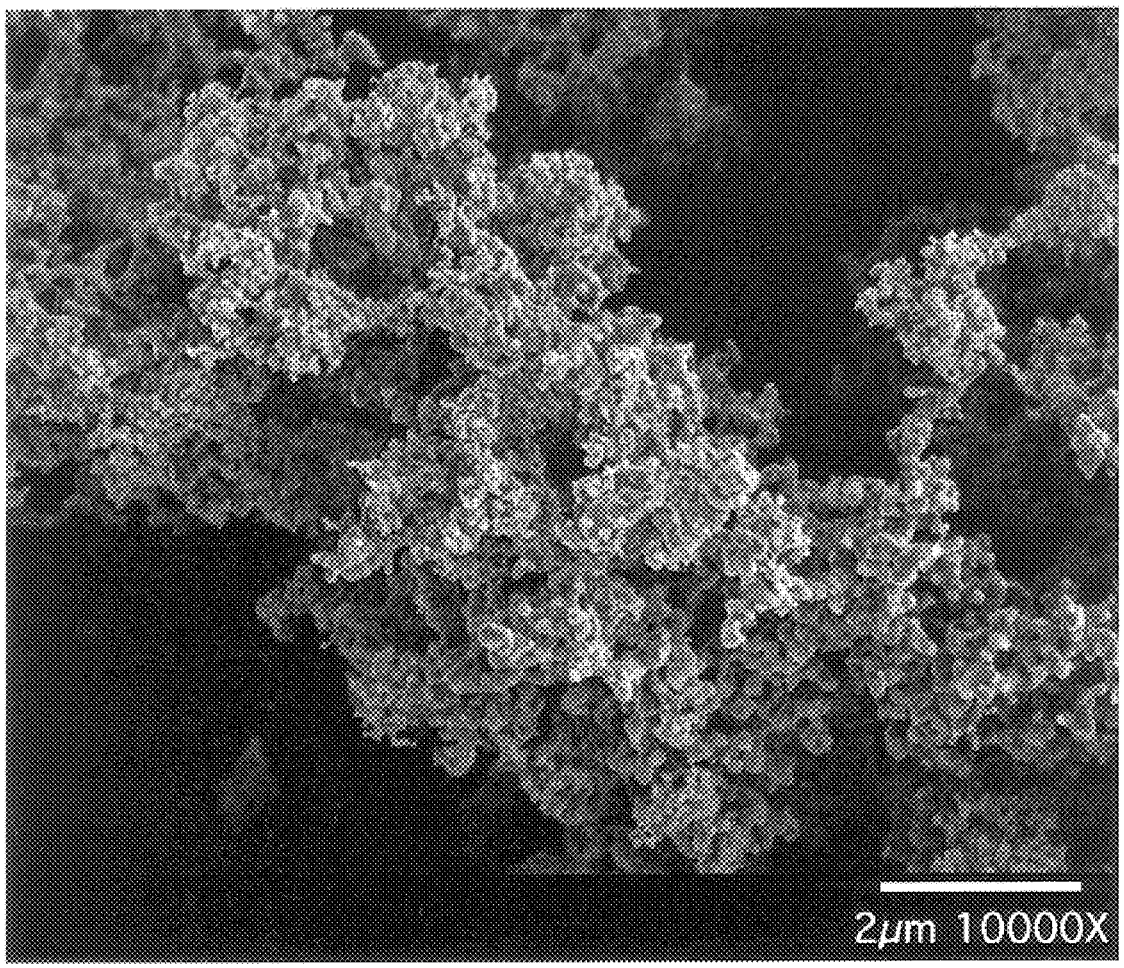
FIG. 3 is a SEM photograph of the nickel containing molding composition prepared in Example 7. This is the nickel metal used to micromold the nickel part. No binder was added as the part coldwelded.
Figure 4:
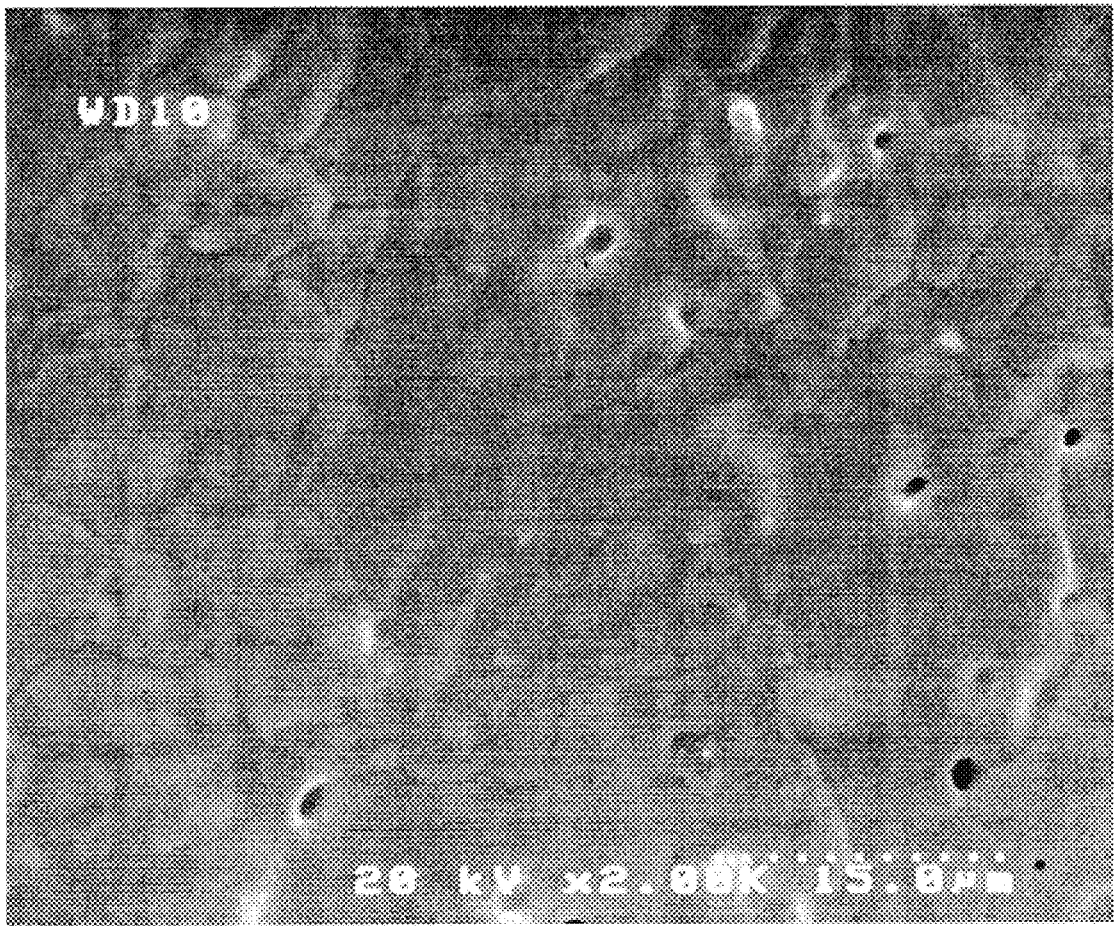
FIG. 4 is a SEM photograph of the surface of the nickel microstructure prepared according to the method of Example 12, magnified ×2.
Figure 5:
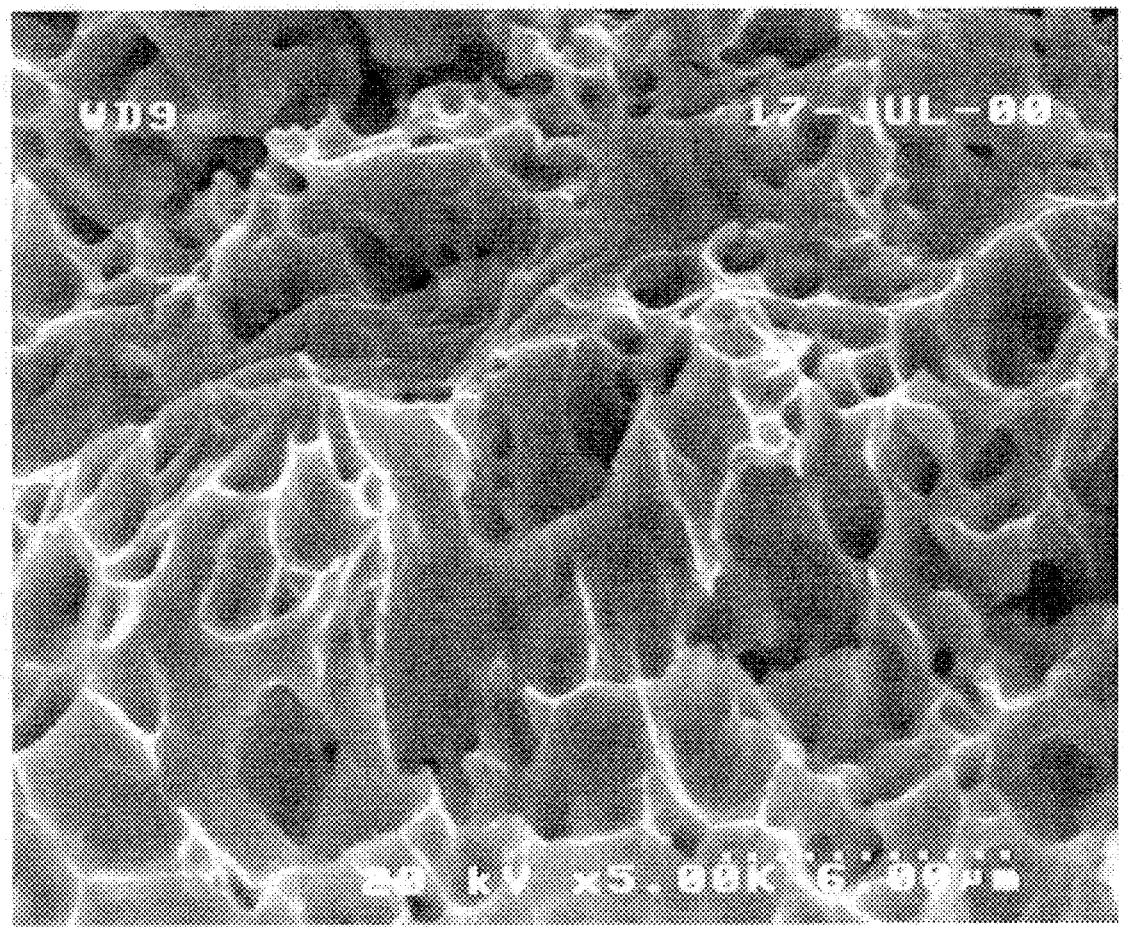
FIG. 5 is a SEM photograph of a fractured surface of the nickel microstructure prepared according to the method of Example 12, magnified ×5.
Figure 6:
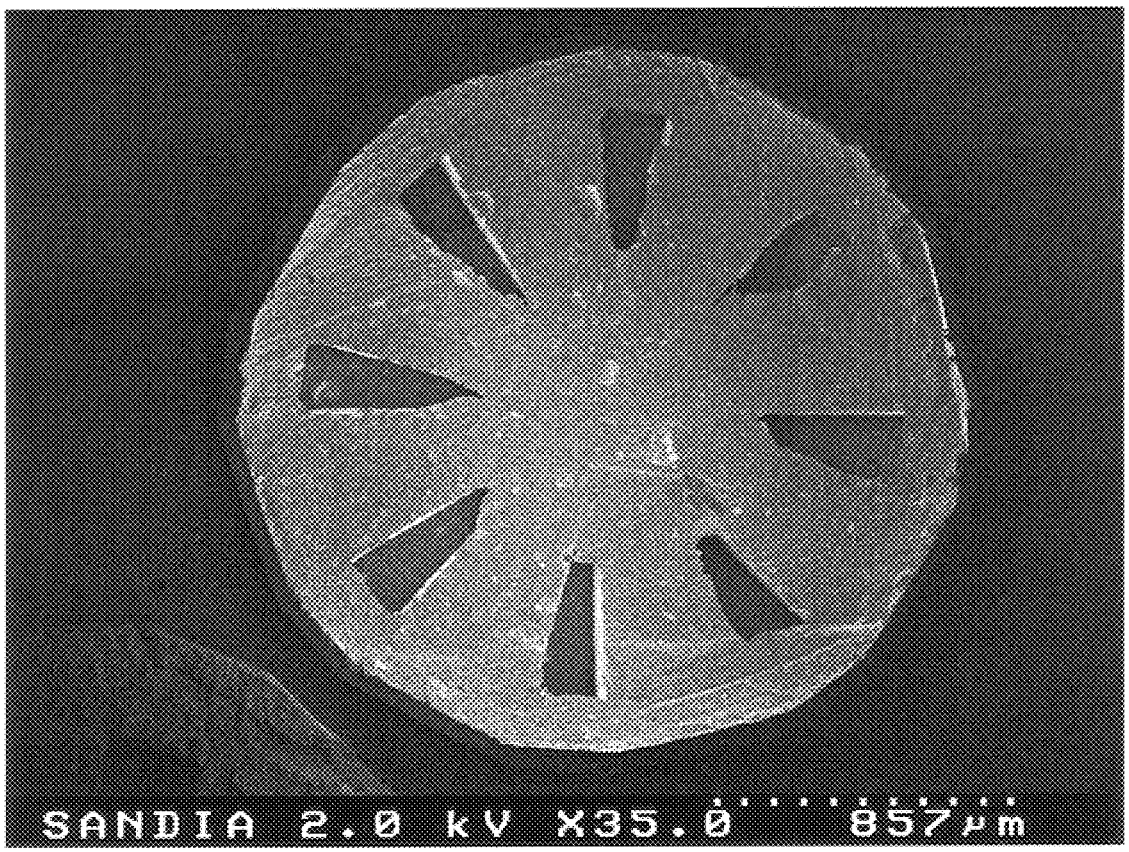
FIG. 6 is a SEM photograph of a nickel microstructure prepared according to the method of Example 12.
Figure 7:
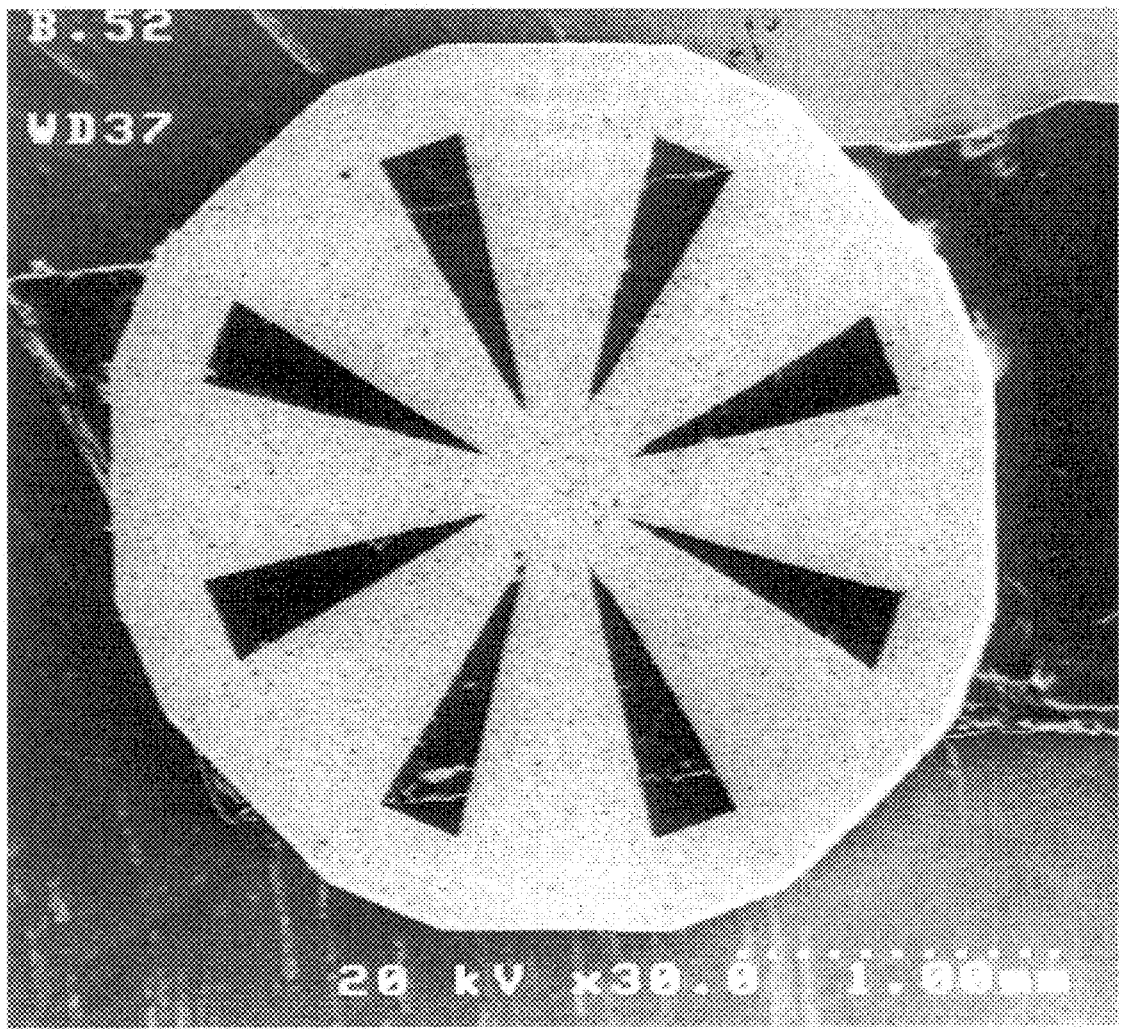
FIG. 7 is a SEM photograph of a stainless steel microstructure prepared according to the method of Example 11.
Figure 8:
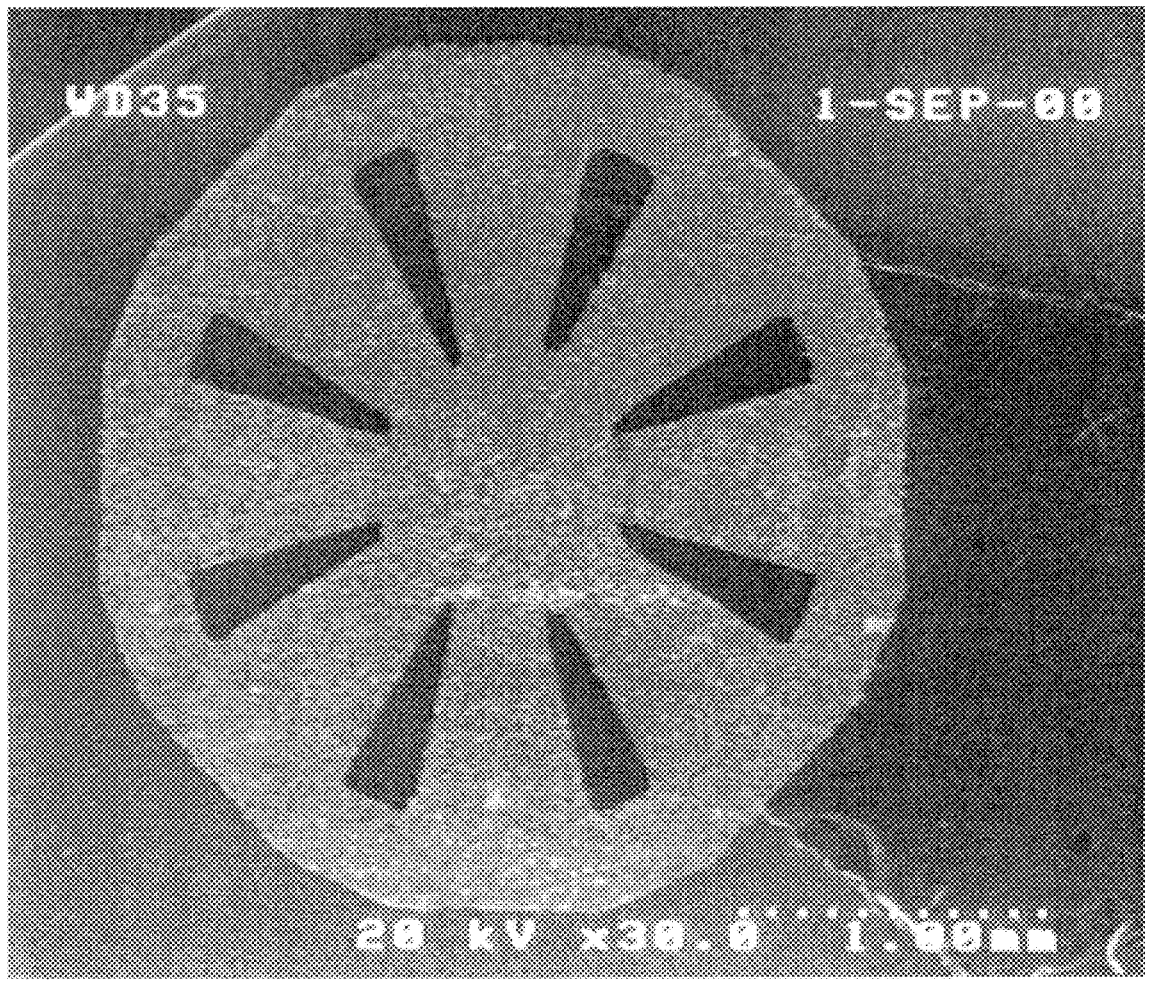
FIG. 8 is a SEM photograph of a copper microstructure prepared according to the method of Example 13.

A method of forming the green microstructures is illustrated schematically in FIG. 2, where, as in FIG. 1, the patterned mold is shown generally at 10, comprised of substrate 12 and voids 16 between corresponding elevated segments 18. The voids 16 are filled with molding composition 14 and covered with several layers of a cleaned vacuum release polymer 24, such as poly(vinyl fluoride). The vacuum release polymer layer is then covered with a layer of elastomer 26, such as polyurethane elastomer. A light coating of vacuum grease may be applied between the polymer layer and the elastomer in order to reduce friction. The covered mold is then compressed using at least 5,000 psi for about one minute, thereby forming the green microstructures within the mold voids 28. The pressure is slowly released and the polymer layers removed. The surface of the mold is then planarized to provide a mold with green microstructures contained therein, as shown in 30. The method of forming the green microstructures illustrated in FIG. 2 is preferably repeated at least three times with the amount of applied pressure increased with each repetition.

The processes of the invention thus provide metallic microstructures, i.e., metallic components having micron or submicron dimensions. The present method is readily scaled up to provide a viable manufacturing process for fabricating metallic microstructures. The method makes use of available equipment and commonly used reagents and materials, and involves relatively mild processing conditions. The invention is useful in a host of applications and technical fields, including MEMS fabrication and semiconductor processing, information storage, medical diagnostics, optics, and the manufacture of structural materials.

It is to be understood that, while the invention has been described in conjunction with the preferred specific embodiments thereof, the foregoing description as well as the examples that follow are intended to illustrate and not limit the scope of the invention. Other aspects, advantages and modifications within the scope of the invention will be apparent to those skilled in the art to which the invention pertains.

All patents, patent applications, and publications mentioned herein are hereby incorporated by reference in their entireties.

Experimental

The following examples are put forth so as to provide those of ordinary skill in the art with a complete disclosure and description of how to carry out the method of the invention. Efforts have been made to ensure accuracy with respect to numbers (e.g., quantities, temperature, etc.) but some errors and deviations should be accounted for. Unless indicated otherwise, parts are parts by weight, temperature is in ° C. and pressure is at or near atmospheric. Additionally, all starting materials were obtained commercially or synthesized using known procedures.

EXAMPLE 1

This example describes preparation of an aluminum-containing molding composition using 100 nm mean particle size aluminum particles, Acrawax® C as a binder, and a mixture of methyl hexahydrophthalic anhydride (MHHPA) and glycerol as the fluxing agent. Acrawax® C, 3.0 wt. %, MHHPA 5.0 wt. %, and 10.0 wt. % glycerol were added to the aluminum particles. Tetrahydrofuran was also added to facilitate mixing by ultrasonic vibration. Subsequently, the molding composition was dried at 70° C. Dried powder cake is comminuted by hand using a razor blade.

EXAMPLE 2

An aluminum-containing molding composition was prepared using 100 nm mean particle size aluminum particles, Acrawax® C as a binder and MHHPA and isopropyl alcohol as fluxing agents. A stock solution of Acrawax® C, 1.0 wt. %, MHHPA 5.0 wt. %, isopropyl alcohol was added to the aluminum particles. The molding composition was then dried at 70° C. Dried powder cake was comminuted by hand using a razor blade.

EXAMPLE 3

An aluminum-containing molding composition was prepared using using 100 nm mean particle size aluminum particles, isopropyl alcohol as a binder and a commercially available carboxylic acid flux paste, (Waterflow 2000, Fry Technology USA, Riviera Beach, Fla.), as the fluxing agent. The resultant molding composition was dried as described in Examples 1 and 2.

EXAMPLE 4

An aluminum-containing molding composition was prepared using 100 nm mean particle size aluminum particles; a binder comprised of 0.5 mg/m$^2$ polymethacrylic acid (PMAA), 0.7 wt. %, polyvinyl alcohol (PVA) and 0.9 wt. %, polyethylene glycol 400 (PEG 400); and a fluxing agent comprised of 5 wt. %, MHHPA, and 10 wt. % glycerol. The resultant molding composition was dried as described in Examples 1 and 2.

EXAMPLE 5

A stainless steel-containing molding composition was prepared by adding 0.5 wt. % Acrawax® C as a lubricant and binder. The Acrawax® C was dispersed in water using ultrasonic vibration and then 1000 nm mean particle size stainless steel particles were added. The resultant molding composition was dried as described in Examples 1 and 2 and then passed through a 400 mesh sieve.

EXAMPLE 6

This example describes preparation of an aluminum microstructure using the molding composition prepared in Example 1. The cavities of a polymethyl methacrylate (PMMA) mold, formed by hot embossing of a PMMA substrate with a LIGA produced microstamp, were covered with excess molding composition. In order to efficiently press the powder into the mold, polymer layers are used to distribute the pressure more uniformly. Six layers of a poly(vinyl fluoride) vacuum release polymer were cleaned with isopropyl alcohol and a small amount of alcohol was used to attach the vacuum release polymer to a 1"×1"×⅛" piece of polyurethane elastomer. The polyurethane elastomer was lightly coated with vacuum grease to reduce friction between the two polymers.

The mold containing the molding composition was placed in a uniaxial press and the two polymers were placed directly on top of the mold. The molding composition was at about 6,000 psi for about one minute. Pressure was slowly released and the mold then removed from the press. The excess molding composition was removed by scraping the surface with an alumina spatula. Excess molding composition was then mounded over the cavities again and the same poly (vinyl fluoride) and polyurethane elastomer were used to compress the powder at about 7,500 psi for one minute. The excess powder was again scraped off and the mold placed in the press using the same poly(vinyl fluoride) and polyurethane elastomer polymers. The final press of about 9,000 psi for one minute was then completed. These pressures are estimations as the polyurethane deforms during pressing, changing the surface area during uniaxial compression.

Once pressing is completed in the PMMA mold, the green microstructures were removed by disolving the mold with methylene chloride and acetone. Approximately 3:1 v/v methylene chloride to acetone was placed in the bottom of a flat alumina crucible in which the microstructures were to be fired. Triceps were used to suspend the mold upside down in the methylene chloride/acetone solution. As the PMMA expanded and dissolved, the microstructures released and fell to the bottom of the crucible. Once all the parts released, the mold was removed and the released parts recovered from the solvent. Residual PMMA was removed from the released parts by placing them in a soxhlet extractor with refluxing dichloromethane.

EXAMPLE 7

This example describes preparation of a green microstructure using the molding composition prepared in Example 1. The cavities of an SU8-25 (SU8) mold, formed by spin coating (1000 rpm, 10 seconds) to a thickness of 100 microns onto a silicon wafer coated with 2000 angstroms of titanium. The purpose of the metal is to keep the aluminum or alumina from reacting with the silicon wafer. After spinning, the SU8 is baked at 95° C. for 15 minutes to harden it. The SU8 is then patterned in a broad band UV contact printer (Karl Suss MA6) using a standard chrome-on-glass lithographic mask (Photosciences, Inc.). The exposed SU8 cross-links and becomes insoluble in the developer. The unexposed SU8 is washed away by the developer, creating the features of the mold. The mold was filled and compressed as described in Example 7. The applied pressure used with an SU8 mold was, however, increased to about 22,500 psi for the first pressing, to about 30,000 psi for the second pressing and to about 37,500 psi for the final pressing.

Unlike the PMMA mold used in Example 6, SU8 molds are not soluble. Therefore, the SU8 mold was charred by heating at about 350° C. and then peeled away from the green aluminum microstructures.

EXAMPLE 8

This example describes the sintering of the green microstructures prepared in Example 7. A tube furnace equipped with a three-inch mullite tube was used. Initially, only one end of the tube was capped. The capped end was connected to the boil off from a liquid nitrogen line for purging of the furnace and to a $H_2/N_2$ line for reducing atmosphere sintering. The green microstructures were placed in the 3" tube furnace and ramped at about 10° C./minute to about 350° C. in air for a minimum of 1 hour to burn off residual PMMA from demolding and the binder components. The furnace was then cooled and the parts covered with flat alumina plate to reduce warping during final sintering. The furnace was flushed for one minute with nitrogen from the liquid nitrogen holding tank and the covered microstructures then replaced into the furnace. The other end of the tube was then capped allowing for only a small flow of gas that vented to the roof of the lab. Throughout the entire sintering process, 0.5 standard cubic centimeters/minute of approximately 3.90% H$_2$/N$_2$ was run through the tube. The furnace was ramped to about 620° C. at roughly 15° C./min for a one-hour dwell period.

EXAMPLE 9

A stainless steel microstructure was prepared using the molding composition prepared in Example 5. The microstructure was molded according to the method described in Example 8 and sintered for 1 hour at 1360° C.

EXAMPLE 10

A nickel microstructure was prepared using nickel nanoparticles without binder as the molding composition. The nickel nanoparticles were dry pressed into a PMMA mold several times as described in Example 6 and sintered for 1 hour at 650° C. in 3.9% H2/N2.

EXAMPLE 11

A copper microstructure was prepared using the copper nanoparticles without binder as the molding composition. The copper nanoparticles were dry pressed into a PMMA mold several times as described in Example 6 and sintered for 1 hour at 950° C. in 3.9% H2/N2.

We claim:

1. A method for preparing a metallic microstructure, comprising:
   (a) providing, as a mold, a substrate having a pattern on its surface, said pattern comprised of elevated segments and corresponding voids therebetween;
   (b) applying a molding composition to the substrate surface and pressing the composition into the voids of the surface pattern to provide a green microstructure in said voids, said molding composition comprising metallic nanoparticles and an optional binder;
   (c) removing the green microstructure from the voids; and
   (d) sintering the green microstructure.

2. The method of claim 1, wherein the molding composition further comprises a fluxing agent.

3. The method of claim 1, further including, prior to step (b), treating the substrate surface.

4. The method of claim 3, wherein the surface treatment comprises deposition of a low adhesion coating comprised of a material-releasing agent.

5. The method of claim 4, wherein the material-releasing agent is tungsten.

6. The method of claim 3, wherein the surface treatment comprises deposition of a metal or alloy layer, which is subsequently incorporated into the green microstructure in step (b).

7. The method of claim 6, wherein the metal or alloy layer is comprised of a metallic material selected from the group consisting of stainless steel, aluminum, nickel, iron, titanium, copper, gold, silver, tungsten, and mixtures thereof.

8. The method of claim 1, wherein step (c) comprises chemically releasing the green microstructures.

9. The method of claim 1, wherein step (c) comprises charring the mold and thereafter peeling the charred mold away from the green microstructure.

10. The method of claim 8, wherein prior to step (d) any organic material contained within the green microstructure is removed and the green microstructure is covered to reduce warping.

11. The method of claim 9, wherein prior to step (d) any organic material contained within the green microstructure is removed and the green microstructure is covered to reduce warping.

12. The method of claim 10, wherein the organic material is removed by heating the green microstructure at a temperature in the range of about 300° to 700° C.

13. The method of claim 10, wherein step (d) is conducted at a temperature in the range of about 300° C. to 1400° C.

14. The method of claim 11, wherein step (d) is conducted at a temperature in the range of about 300° C. to 1400° C.

15. The method of claim 1, wherein the metallic nanoparticles are in the range of approximately 1 to 1000 nanometers in diameter.

16. The method of claim 15, wherein the metallic nanoparticles are in the range of approximately 1 to 500 nanometers in diameter.

17. The method of claim 16, wherein the metallic nanoparticles are in the range of approximately 1 to 100 nanometers in diameter.

18. The method of claim 1, wherein the metallic nanoparticles are comprised of a metallic material selected from the group consisting of stainless steel, aluminum, nickel, iron, titanium, copper, gold, silver, tungsten, and mixtures thereof.

19. The method of claim 1, wherein the mold used in part (a) is a lithographically patterned mold and the voids of the surface pattern are less than about 100 microns in diameter, so that the resulting green microstructure is less than about 100 microns in diameter.

20. The method of claim 1, wherein the mold is a plastic replicate made by hot embossing, injection molding or casting using a LIGA prepared stamp.

21. The method of claim 1, wherein the mold is comprised of a negative photoresist.

22. The method of claim 1, wherein the binder is present.

23. The method of claim 1, wherein the metallic nanoparticles represent approximately 5 wt. % to approximately 100 wt. % of the molding composition.

24. The method of claim 2, wherein the fluxing agent comprises an acid or strong base.

25. The method of claims 24, wherein the acid or strong base is selected from the groups consisting of, carboxylic acids, amines and phenols.

26. The method of claim 24, wherein the fluxing agent comprises a mixture of an anhydride and a member of the group consisting of water, alcohols and polyols.

27. The method of claim 25, wherein the fluxing agent comprises an alcohol or a polyol.

28. The method of claim 27, wherein the alcohol or polyol is selected from the group consisting of methanol, ethanol, propanol, butanol, isobutanol, isopropanol, butyl carbitol, ethylene glycol, glycerol, mesoerythritol. adonitol and sorbitol.

29. The method of claim 2, wherein the fluxing agent represents approximately 5 wt. % to 30 wt. % of the molding composition.

30. The method of claim 1, wherein the elevated segments are comprised of a photoresist material.

31. The method of claim 30, wherein the photoresist material is poly(methyl methacrylate).

32. The method of claim 20, wherein the plastic material is poly(methyl methacrylate).

33. The method of claim 1, wherein the substrate is comprised of metallized silicon.

34. The method of claim 1, wherein step (b) is repeated prior to step (c).

35. The method of claim 34, wherein step (b) further comprises planarizing the substrate surface to remove excess molding composition after the composition is pressed into the voids.

36. The method of claim 35, wherein step (b) is repeated at least three times.

37. The method of claim 36, wherein in each repetition of step (b) the molding composition is pressed into the voids with greater pressure than used in the previous pressing.

38. The method of claim 37, wherein the substrate is comprised of poly(methyl methacrylate).

39. The method of claim 38, wherein the pressure used in step (b) ranges from about 5,000 psi to about 10,000 psi.

40. The method of claim 21, wherein the mold is comprised of SU8-25.

41. The method of claim 40, wherein the pressure used in step (b) ranges from about 20,000 psi to about 40,000 psi.

42. A method for preparing a metallic microstructure, comprising:
   (a) providing a lithographically patterned mold comprising a substrate having a pattern on its surface, said pattern comprised of elevated segments and corresponding voids therebetween, said voids having a diameter of less than about 100 microns in diameter;
   (b) applying a molding composition to the substrate surface and pressing the composition into the voids of the surface pattern, said molding composition comprising a paste of:
      (i) metallic nanoparticles having a diameter in the range of approximately 1 nm to 1000 nm;
      (ii) an optional binder; and
      (iii) a fluxing agent comprised of a member of the group consisting of acids, strong bases and mixtures of an anhydride and a member of the group consisting of water, alcohols and polyols; and
   (c) repeating step (b) with increasing pressure to form a green microstructure;
   (d) removing the green microstructure from the voids; and
   (e) sintering the green microstructure to form a metallic microstructure.

43. A metallic microstructure prepared by the process of claim 1.

44. A metallic microstructure prepared by the process of claim 42.

* * * * *